United States Patent
Wang et al.

(10) Patent No.: US 7,585,702 B1
(45) Date of Patent: Sep. 8, 2009

(54) STRUCTURE AND ASSEMBLY PROCEDURE FOR LOW STRESS THIN DIE FLIP CHIP PACKAGES DESIGNED FOR LOW-K SI AND THIN CORE SUBSTRATE

(75) Inventors: Wen-chou Vincent Wang, Cupertino, CA (US); Yuan Li, Sunnyvale, CA (US); Bruce Euzent, Sunnyvale, CA (US); Vadali Mahadev, San Jose, CA (US)

(73) Assignee: Altera Corporation, San Jose, CA (US)

( * ) Notice: Subject to any disclaimer, the term of this patent is extended or adjusted under 35 U.S.C. 154(b) by 423 days.

(21) Appl. No.: 11/270,676

(22) Filed: Nov. 8, 2005

(51) Int. Cl.
*H01L 21/44* (2006.01)
(52) U.S. Cl. .............. 438/122; 438/108; 257/706; 257/E23.051; 257/E31.131; 257/E33.075
(58) Field of Classification Search ............. 438/121, 438/122, 108, 127; 257/705, 706, E23.051, 257/E31.131, E33.075
See application file for complete search history.

(56) References Cited

U.S. PATENT DOCUMENTS

| | | | |
|---|---|---|---|
| 5,015,803 A | 5/1991 | Mahulikar et al. | |
| 5,909,056 A | 6/1999 | Mertol | |
| 6,015,722 A | 1/2000 | Banks et al. | |
| 6,091,603 A | 7/2000 | Daves et al. | |
| 6,103,550 A | 8/2000 | Camenforte et al. | |
| 6,104,093 A | 8/2000 | Caletka et al. | |
| 6,191,478 B1 * | 2/2001 | Chen | 257/718 |
| 6,262,489 B1 | 7/2001 | Koors et al. | |
| 6,472,762 B1 | 10/2002 | Kutlu | |
| 6,504,242 B1 | 1/2003 | Deppisch et al. | |
| 6,566,748 B1 | 5/2003 | Shimizu et al. | |
| 6,617,683 B2 | 9/2003 | Lebonheur et al. | |
| 6,621,160 B2 | 9/2003 | Shibamoto et al. | |
| 6,744,132 B2 | 6/2004 | Alcoe et al. | |
| 6,756,685 B2 | 6/2004 | Tao | |
| 6,773,963 B2 | 8/2004 | Houle | |
| 6,784,535 B1 | 8/2004 | Chiu | |
| 6,784,541 B2 | 8/2004 | Eguchi et al. | |
| 6,815,817 B2 * | 11/2004 | Akram et al. | 257/737 |
| 6,909,176 B1 | 6/2005 | Wang et al. | |
| 6,949,404 B1 | 9/2005 | Fritz et al. | |
| 6,999,317 B2 * | 2/2006 | Chengalva et al. | 361/715 |
| 7,023,089 B1 * | 4/2006 | Lu | 257/751 |
| 7,180,173 B2 * | 2/2007 | Kuo et al. | 257/706 |
| 2004/0016996 A1 | 1/2004 | Tang | |
| 2004/0150118 A1 | 8/2004 | Honda | |
| 2004/0155358 A1 | 8/2004 | Iijima | |
| 2004/0188862 A1 | 9/2004 | Nagarajan et al. | |
| 2005/0199998 A1 * | 9/2005 | Chen et al. | 257/706 |

* cited by examiner

*Primary Examiner*—Quoc D Hoang
(74) *Attorney, Agent, or Firm*—Weaver Austin Villeneuve & Sampson LLP

(57) ABSTRACT

Provided are semiconductor die flip chip packages and semiconductor die flip chip package components where certain properties of the packages/components are controlled to facilitate management of the package stresses. Also provided are fabrication methods for such packages and package components. For instance, the thickness of a die can be controlled such that the stress generated/experienced by the die is minimized. As such, the package stress is managed to suitable levels for incorporation of a low-K Si die and/or a thin package substrate. Further, a thin die can be attached to a heat spreader to increase the rigidity for easier handling during fabrication of the semiconductor die flip chip package.

12 Claims, 8 Drawing Sheets

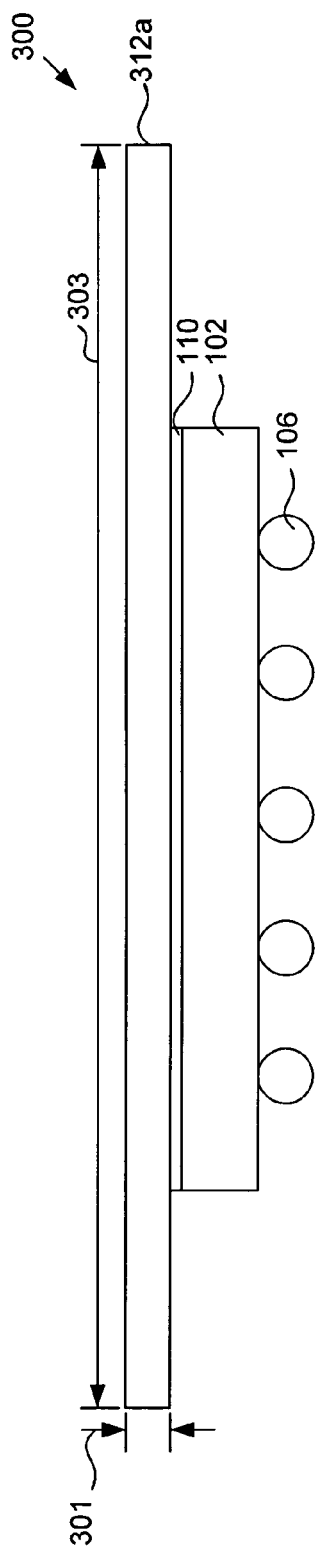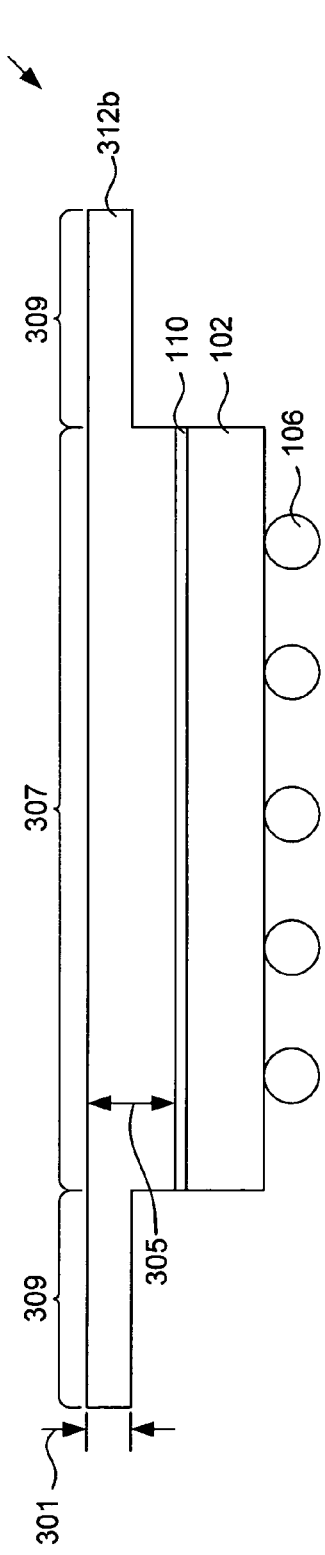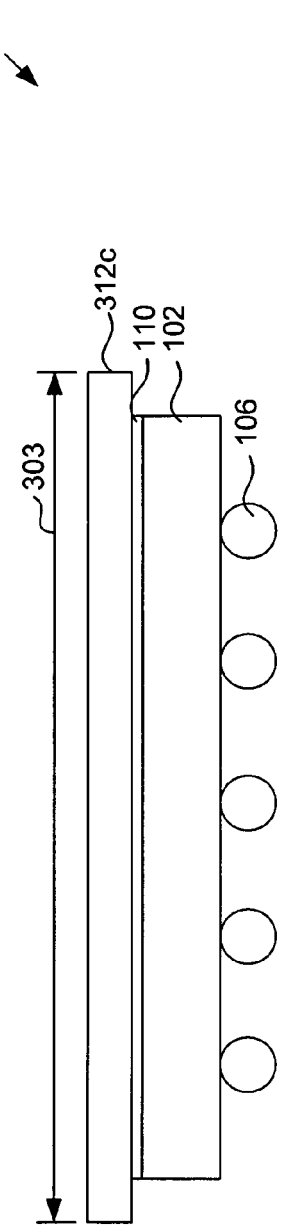

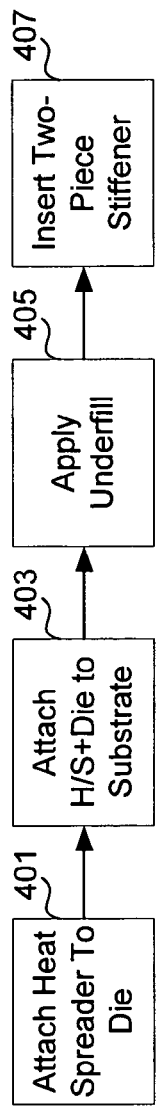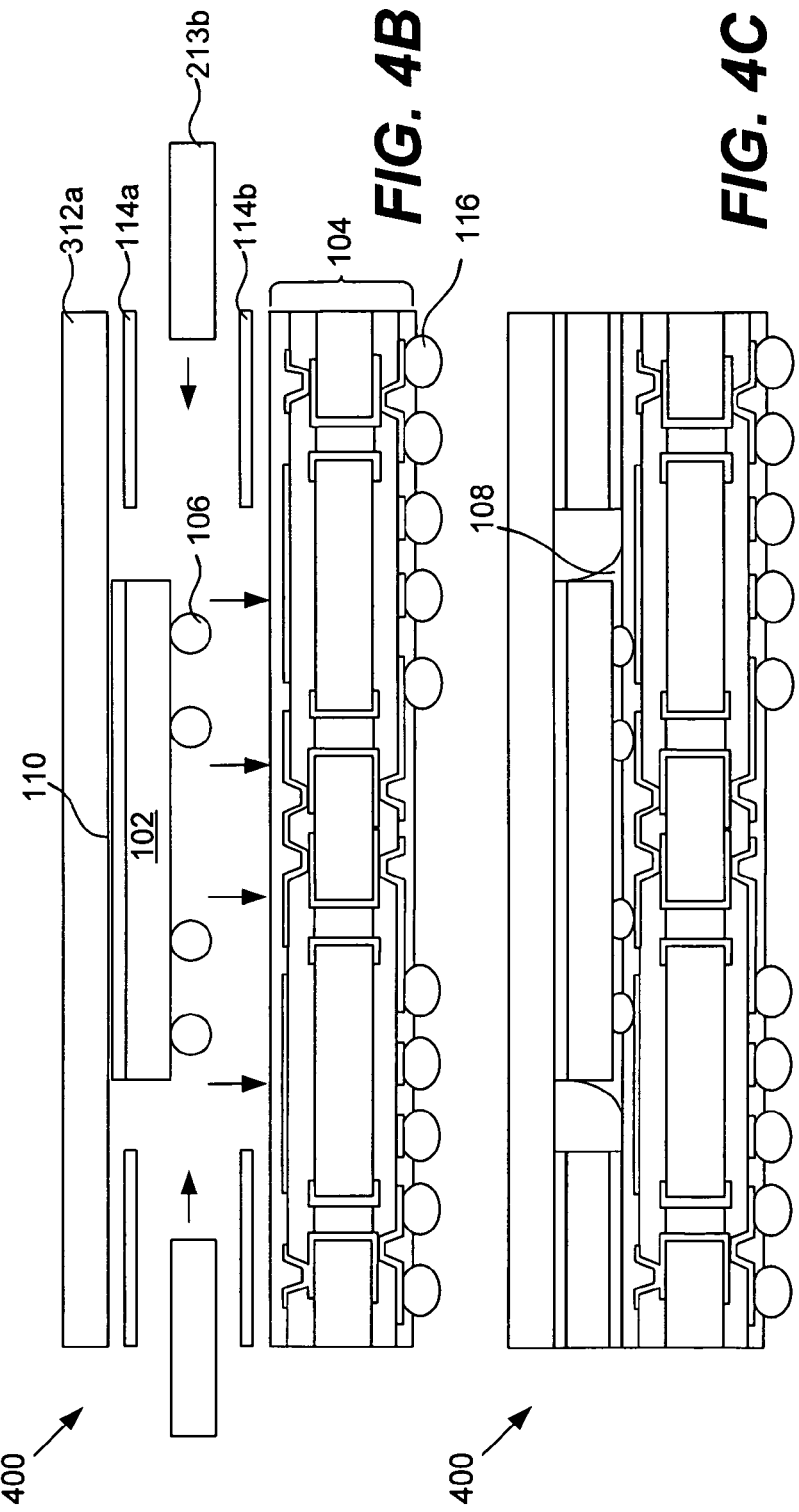

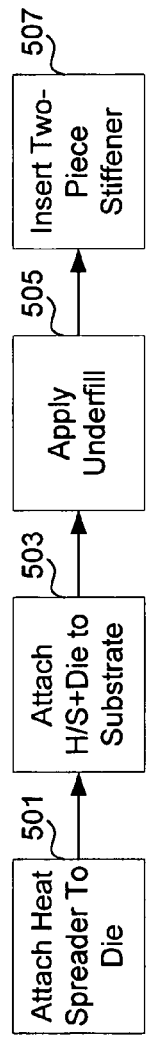
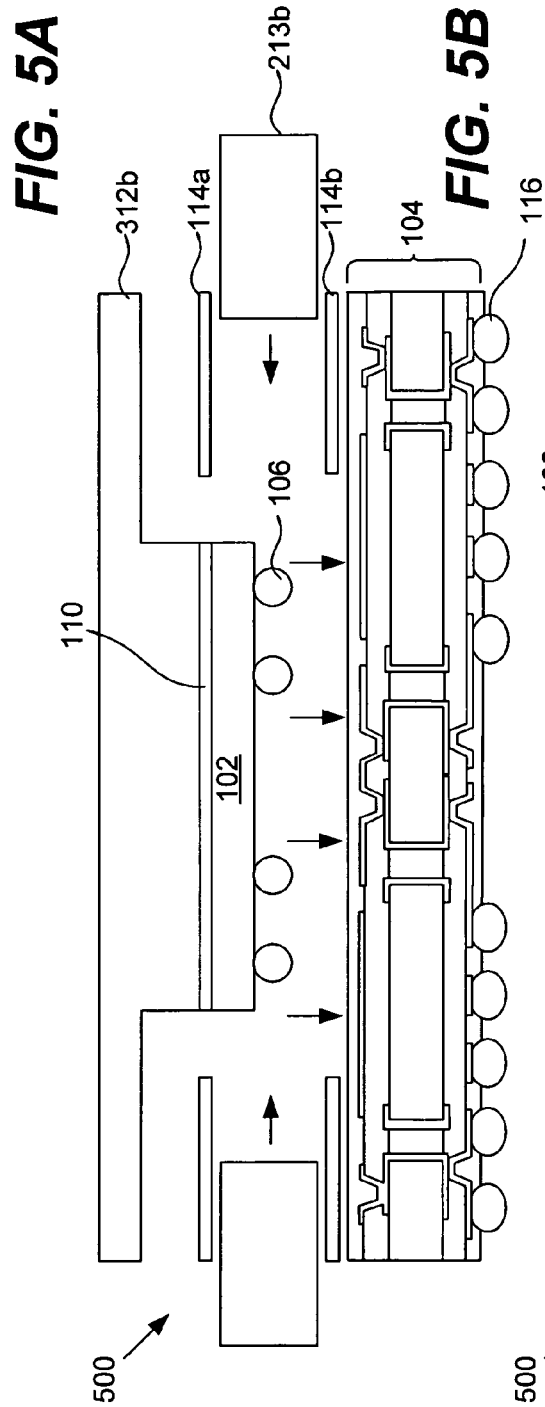
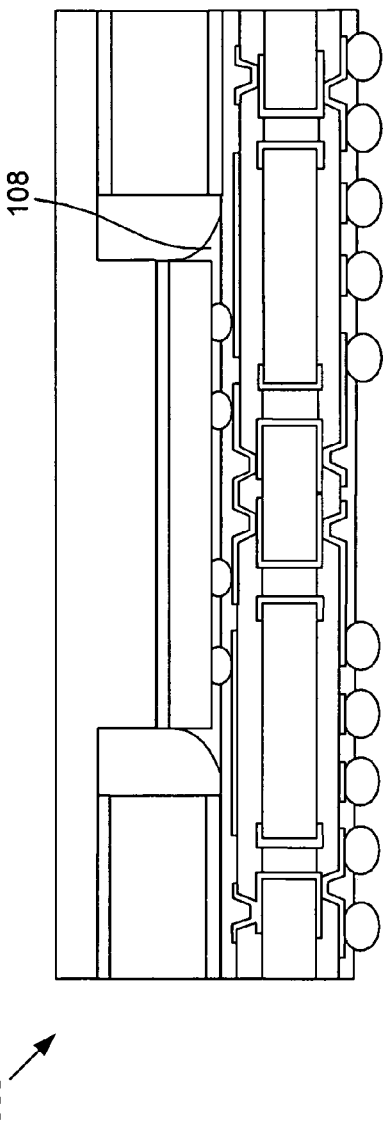
FIG. 5A
FIG. 5B
FIG. 5C

# STRUCTURE AND ASSEMBLY PROCEDURE FOR LOW STRESS THIN DIE FLIP CHIP PACKAGES DESIGNED FOR LOW-K SI AND THIN CORE SUBSTRATE

BACKGROUND

This invention relates generally to semiconductor device packages, and in particular to semiconductor die flip chip packages. More specifically, the invention relates to structures and assembly procedures for low stress thin die flip chip packages suited for low-K Si dice and/or thin core substrates.

In semiconductor device package assembly, a semiconductor die (also referred to as an integrated circuit (IC) chip or "chip") may be bonded directly to a package substrate. Such die is formed with bumps of solder affixed to its I/O bonding pads. During conventional packaging assembly, the die is "flipped" onto its front surface (e.g., active circuit surface) so that the solder bumps form electrical and mechanical connections directly between the die and conductive metal pads on the package substrate. Underfill is then applied between the gap formed by the solder bumps in order to further secure the die to the package substrate. Next, a stiffener made of substantially copper is placed around the die and attached to the package substrate. Lastly, a heat spreader is attached over the die and the stiffener. A semiconductor device package of this type is commonly called a "semiconductor die flip chip package."

A problem with such a semiconductor die flip chip package is that it is subject to different temperatures during the packaging process. For instance, different temperatures arise with the cool down from the solder joining temperature and the underfill curing temperature. As a result, the package is highly stressed due to the different coefficients of thermal expansion (CTE) of the various package and die materials. The high stress experienced by bonded materials during cooling may cause them to warp or crack and cause the package structure to bow, thereby, adversely affecting the board level reliability of the package. In some cases, the bow of the package will exceed the co-planarity specification for the semiconductor die flip chip package.

As the semiconductor industry seeks to improve the performances of semiconductor die flip chip packages, there is a drive towards using low-K Si dice (including extra-low-K Si dice) and/or thin package substrates (in particular thin core or coreless package substrates) in semiconductor die flip chip packages. However, as compared to traditional dielectric materials in conventional silicon based dice, the low-K dielectric materials in low-K Si dice are brittle and tend to crack under substantially less stress. As such, it is possible for the reliability of a low-K Si die to be compromised due to cracking of the low-K dielectric material. In addition, thin package substrates allow the transfer of stress to become more direct between components coupled to the thin package substrates. As such, the CTE mismatches between the die, bumps, underfill, package substrate, and BGA balls can cause earlier failures in a semiconductor die flip chip package during board level reliability tests.

Accordingly, what is needed are semiconductor die flip chip packages and corresponding assembly methods that can incorporate low-K Si dice and/or thin package substrates such that their board level reliabilities and/or their package warpages (e.g., co-planarity) can come within acceptable limits for incorporation into electronic devices.

SUMMARY OF THE INVENTION

To achieve the foregoing, the present invention provides a semiconductor die flip chip package and a semiconductor die flip chip package component where aspects of the package and the component are controlled to facilitate management of the package stress. The present invention also provides fabrication methods for such packages. For instance, the thickness of the die can be controlled such that the stress generated/experienced by the die is minimized. As such, the package stress is managed to suitable levels for incorporation of a low-K Si die and/or a thin package substrate.

In one aspect, the invention relates to a semiconductor device package component. The semiconductor device package component consists essentially of a die and a heat spreader. The die has top and bottom surfaces where the heat spreader is coupled to the top surface of the die. As such, a manageable semiconductor device package component can be realized for facilitating efficient assembly of a semiconductor device package.

In another aspect, the invention relates to a method for packaging a semiconductor device. The method includes coupling a heat spreader to a die. The die has top and bottom surfaces. The method also includes coupling the die to a package substrate. The package substrate has die and board surfaces. The coupling of the heat spreader to the die is performed before coupling the die to the package substrate. As such, a thin die may be effectively incorporated into the packaging of a semiconductor device.

In another aspect, the invention again relates to a semiconductor device package component. The semiconductor device package consists essentially of a die and means for dissipating heat from the die. The die can be a low-K Si die. Further, the semiconductor device package component can be used in conjunction with a thin package substrate in producing a semiconductor device package.

Various aspects of the present invention can allow fabrication of a semiconductor device package with less bowing and so improved co-planarity (e.g., in compliance with industry specifications) with the surface to which it is ultimately bound, thereby, improving the reliability of the package. Moreover, a package that is relatively lighter and more robust than conventional semiconductor die flip chip packages can be realized.

These and other features and advantages of the invention will be presented in more detail below with reference to the associated drawings.

BRIEF DESCRIPTION OF THE DRAWINGS

FIG. 3A illustrates a cross-sectional view of a semiconductor device package component according to various embodiments of the present invention.

FIG. 3B illustrates a cross-sectional view of a semiconductor device package component according to various embodiments of the present invention.

FIG. 3C illustrates a cross-sectional view of a semiconductor device package component according to various embodiments of the present invention.

FIG. 4A illustrates a process flow for assembling a semiconductor die flip chip package having a two-piece stiffener and a heat spreader of FIG. 3A.

FIG. 4B illustrates a cross-sectional view of a disassembled semiconductor die flip chip package having a two-piece stiffener and a heat spreader of FIG. 3A.

FIG. 4C illustrates a cross-sectional view of an assembled semiconductor die flip chip package having a two-piece stiffener and a heat spreader of FIG. 3A.

FIG. 5A illustrates a process flow for assembling a semiconductor die flip chip package having a two-piece stiffener and a heat spreader of FIG. 3B.

FIG. 5B illustrates a cross-sectional view of a disassembled semiconductor die flip chip package having a two-piece stiffener and a heat spreader of FIG. 3B.

FIG. 5C illustrates a cross-sectional view of an assembled semiconductor die flip chip package having a two-piece stiffener and a heat spreader of FIG. 3B.

DETAILED DESCRIPTION OF SPECIFIC EMBODIMENTS

Figure 1:
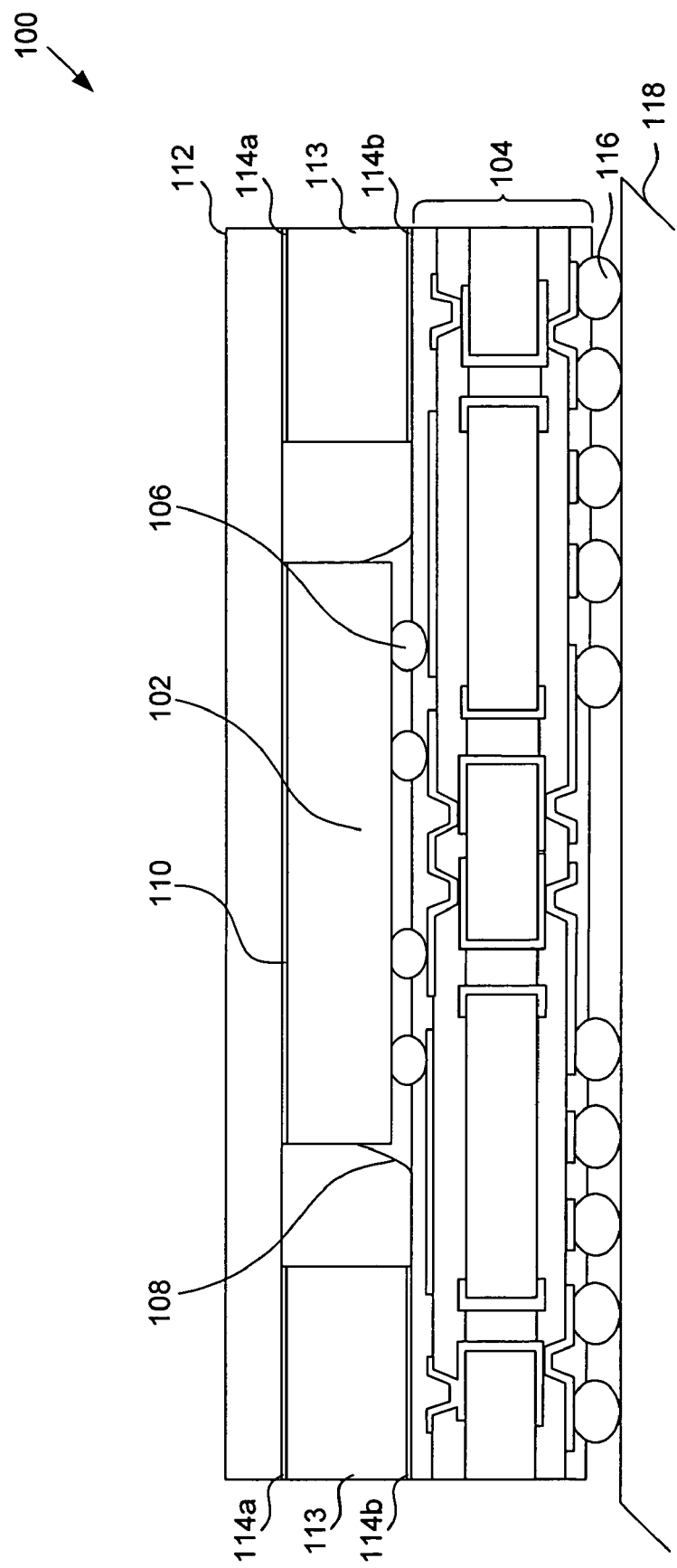
FIG. 1 illustrates a cross-sectional view of a semiconductor device package according to various embodiments of the present invention.

Reference will now be made in detail to specific embodiments of the invention. Examples of the specific embodiments are illustrated in the accompanying drawings. While the invention will be described in conjunction with these specific embodiments, it will be understood that it is not intended to limit the invention to such specific embodiments. On the contrary, it is intended to cover alternatives, modifications, and equivalents as may be included within the spirit and scope of the invention as defined by the appended claims. In the following description, numerous specific details are set forth in order to provide a thorough understanding of the present invention. The present invention may be practiced without some or all of these specific details. In other instances, well known process operations have not been described in detail in order not to unnecessarily obscure the present invention.

Provided are semiconductor die flip chip packages and semiconductor die flip chip package components where certain properties of the packages/components are controlled to facilitate management of the package stresses. Also provided are fabrication methods for such packages and package components. For instance, the thickness of a die can be controlled such that the stress generated/experienced by the die is minimized. As such, the package stress is managed to suitable levels for incorporation of a low-K Si die (or an extra low-K Si die) and/or a thin package substrate (including a coreless package substrate). Further, a thin die can be attached to a heat spreader to form a combined complex with increased rigidity, thereby facilitating easier handling of the thin die during fabrication of the semiconductor die flip chip package.

As advances in semiconductor technology (e.g., Si technologies beyond 0.13 μm) further increase the speeds of silicon chips, a shift towards using Si die with a plurality of layers of low dielectric constant (low-K) material have been sought. Low-K material assists in the reduction of propagation delay because of the lower dielectric constant, thereby the electrical performance of a low-K Si die is typically better. On the other hand, however, such low-K material is usually very brittle in nature and more susceptible to damage under stress (e.g., cracking due to CTE mismatches between package materials). Therefore, the reliability of a low-K Si die in a semiconductor die flip chip package may be compromised.

Similarly, thinner package substrates, particularly package substrates with thinner cores (e.g., thin core build up package substrates), provide many performance advantages. Generally, thinner package substrates have lower inductance, lower simultaneous switching noise (SSN), and higher signal integrity; thereby, improving the electrical performance of the semiconductor die flip chip package. However, a thinner package substrate will increase the direct transfer of stress between the silicon die and printed circuit board (PCB), which in turn could affect the package's board level reliability. Therefore, a thin package substrate (e.g. core with a thickness between 60 and 400 microns) has a better electrical performance than a thick package substrate (e.g., core with a thickness between 800 and 1000 microns), but may not provide a semiconductor die flip chip package with an acceptable board level reliability.

The present invention recognizes that the stress level in the die must be managed in order to improve the reliability of the semiconductor die flip chip package. A major contribution of the stress in a die is from the CTE mismatches between the Si portion of the die, the materials of the package substrate, and the printed circuit board. The stress is higher with a larger and/or thicker die. As such, a reduction of the thickness of the die can reduce the stress levels in the die. In general, the thinner a die is, the less stress the die will generate/experience in the semiconductor die flip chip package. For example, a thin die (e.g., 6-20 mils thick) generates less stress and produces a package with a better board level reliability than that of a relatively thick die (e.g., 31 mils thick). Further, a thin die has better heat dissipation. However, a thin die is hard to handle under conventional semiconductor die flip chip package assembly methods. That is, although a thin die can lower the package stress, improve the reliability and has better heat dissipation qualities, the conventional flip chip assembly process is inadequate to accommodate the thin die due to its higher flexibility and tendency to warp. Therefore, a variety of strategies are disclosed for accommodating a relatively thin die for implementation into a semiconductor device in accordance with various aspects of the present invention.

To begin, a general overview of an assembled semiconductor device package is described. FIG. 1 illustrates a cross-sectional view of a semiconductor device package according to various embodiments of the present invention. As shown, a semiconductor die flip chip package 100 having a die (e.g., Si die, low-K Si die, or extra low-K Si die) 102 and package substrate 104 are electrically connected by solder bumps 106.

Die 102 typically has a CTE of about 2-3 ppm/° C. (e.g., 2.6 ppm/° C. for Si). However, a low-K Si die may include a plurality of layers of low-K dielectric material having a CTE between the range of 20 ppm/° C. and 50 ppm/° C. Further, the low-K dielectric material may have a dielectric constant below that of silicon dioxide and ranges from about 2.6 to 3.5. On the other hand, an extra low-K die may include a plurality of layers of extra low-K dielectric material having a CTE between the range of 10 ppm/° C. and 40 ppm/° C. along with a dielectric constant between 2.2 and 2.6.

Generally, the plurality of dielectric layers can have any number of low-K or extra low-K materials including, but not limited to: aerogel, xerogel, NANOGLASS® (available from Honeywell, Morristown, N.J.), FLARE™ (available from Honeywell, Morristown, N.J.), SiLK™ (available from The Dow Chemical Company, Midland, Mich.), LKD® (available from JSR Micro, Sunnyvale, Calif.), CORAL® (available from Novellus Systems, Inc., San Jose, Calif.), and Black Diamond™ (available from Applied Materials, Inc., Santa Clara, Calif.). Black Diamond™ typically has a CTE in the range of about 20-23 ppm/° C. whereas SiLK™ has a CTE of about 50 ppm/° C. The overall low-K Si die CTE may remain in the same range as a non-low-K Si die, about 2-3 ppm/° C. (e.g., 2.6 ppm/° C.). Typically, the low-K materials form a plurality of layers that has a thickness that is 1/100 (e.g. 5 microns) of the overall low-K Si die thickness (e.g., 500-750 microns). In some cases, the thickness of the plurality of low-K layers is less than 6 microns.

Although die 102 may have dimensions on the order of about 4-900 mm$^2$ or 21-32 mils thick, aspects of the present invention are advantageously applied to packages having a thin die with dimensions on the order of 6-20 mils thick. Further, in combination with the thin die, the present invention is advantageously applied to packages where the die also has a large die size, for example, 100 mm$^2$ or larger (e.g., 10×10 mm, 20×20 mm, 20×23 mm, 22×22 mm, 23×28 mm 25×25 mm, or 26×32 mm). It should be noted that a thin die with a large die size is less rigid, thus, more fragile to handle than a thin die with a small die size.

Package substrate 104 is typically composed of an organic or laminate material, such as fiberglass, PTFE (such as Teflon™, available form Gore, Eau Claire, Wis.) bismaleimide triazine (BT) resin, epoxy laminates or ceramic-plastic composites. Package substrate 104 may include various build up types (e.g., 2/2/2, 3/2/3, 4/2/4, etc.) Package substrate 104 may have a CTE of about 15-20 ppm/° C., a core CTE of about 13-19 ppm/° C., a buildup layer CTE of about 45-100 ppm/° C., and/or a modulus of about 24-25 GPa.

As mentioned earlier, there is a drive in the semiconductor industry towards implementing semiconductor die flip chip packages with thinner package substrates, particularly package substrates with thinner cores. Generally, thinner package substrates have lower inductance, lower signal propagation delay from the die to the PCB, and higher signal integrity; thereby, improving the electrical performance of the semiconductor die flip chip package. A conventional package substrate may include a core with a thickness between 800 and 1000 microns. Thinner package substrates may include a core with a thickness between 60 and 400 microns. Some thinner package substrates may even be coreless. It will be appreciated by those skilled in the art that the present invention may be adapted to use thinner package substrates in semiconductor die flip chip packages while meeting industry co-planarity and reliability specifications.

Die 102 and package substrate 104 are electrically connected and mechanically bonded in a solder joining operation. The unbonded die has an array of solder bumps arranged on its front surface. The solder is generally composed of a lead material having a melting point of about 300° C., for example. Alternatively, the solder can be a eutectic material having a melting point of about 180° C. or higher (e.g., 183° C.).

Prior to bonding the die to a package substrate, solder flux is generally applied to the respective surface of the die or the package substrate. The flux serves primarily to aid the flow of the solder, such that the solder bumps make good contact with pre-solder covered metal pads on the package substrate. It may be applied in any of a variety of methods, including brushing or spraying, or dipping the die into a thin film, thereby coating the solder bumps with flux. The flux generally has an acidic component, which removes oxide barriers from the solder surfaces, and an adhesive quality, which helps to prevent the die from moving on the package substrate surface during the assembly process. Non-cleaning or high temperature cleaning fluxes, as are known in the art, may be used.

After the flux is applied, the die is aligned with and placed onto a placement site on the package substrate such that the die's solder bumps are aligned with pre-solder covered metal pads on substrate 104. The pre-solder covered metal pads are electrically connected to the electrical traces within the substrate. Heat, typically above 200° C. (e.g., 240° C.), is applied to one or more of the die and the package substrate, causing the solder bumps 106 to alloy and form electrical connections between die 102 and package substrate 104. The package is then cooled to harden the connection. Then, where necessary, the remaining flux residue is substantially removed in a cleaning step, for instance by washing with an appropriate solvent.

An underfill 108 is generally applied in order to enhance the mechanical bonding of the die and package substrate. Underfill 108 may include polymers or fillers. Underfill 108 generally has a CTE of about 32 ppm/° C. In one embodiment, underfill 108, typically a thermo-set epoxy, such as is available from Hysol Corporation of Industry, Calif. (e.g., product numbers 4549, 8439), Ablestik Laboratories of Rancho Domingo, Calif., or Namics, Reno, Nev. (e.g., product no. 8439-1) is dispensed into the remaining space (or "gap") between the die and the package substrate. In a typical procedure, a bead of thermo-set epoxy is applied along one edge of the die where it is drawn under the die by capillary action until it completely fills the gap between the die and the package substrate. Slight heating of the package substrate during dispensing of the underfill epoxy may assist the flow. In some cases, the underfill epoxy flow is further assisted by vacuum, or, alternatively, by injection of the epoxy into the gap. It should be noted that there may be other methods for applying underfill and that any suitable underfill composition (including those incorporating solder flux) application may be used in conjunction with the present invention.

Underfill 108 is often cured by heating the package substrate and die to an appropriate curing temperature for the underfill material, generally about 150° C., and curing for a specific amount of time at the temperature. In this manner, the process produces an electrically and mechanically bonded semiconductor chip assembly, with the underfill material allowing a redistribution of the stress at the connection between the die and the substrate from the solder joints only to the entire substrate-die area. It is important to note that during the cooling down from the underfill cure temperature to the room temperature, large amounts of stress due to the CTE mismatch between the substrate (e.g., CTE about 17 ppm/° C.) and the die (e.g., CTE about 2.6 ppm/° C.) may cause the package to warp. In general, warpage is greatest after the underfill is applied.

Package 100 includes a heat spreader 112 composed of a high modulus (e.g., about 60 to 200 GPa), high thermal conductivity (e.g., about 160 to 400 W/cm·K; 380 W/m·K for copper) material, having substantially the same dimensions as the package substrate. The heat spreader material is typically selected to have a CTE the same as or sufficiently similar to the substrate in order to apply a counter stress to the die and to reduce the bow of the package 100 to within the tolerance of the industry co-planarity specification (about 0.20 mm or 8 mils per JDEC). For example, typical organic substrate materials have CTEs in the range of about 15-20 ppm/° C., therefore, the heat spreader should have a CTE in this range. Moreover, the heat spreader material should have a modulus of elasticity and thickness to balance that of the substrate. Examples of suitable materials include copper; nickel-plated copper; aluminum; and copper alloys (such as Olin194 (ASTM Spec. No. B465), available from Olin Brass, East Alton, Ill.), each with a thickness selected to achieve a balance with the force applied to the front surface of die 102 by substrate 104.

Heat spreader 112 is connected to the back surface of die 102. The connection is provided via a relatively high thermal conductivity thermal interface material (TIM) 110 that creates a bond between heat spreader 112 and the back surface of die 102. Thermal interface material 110 can include thermal polymers having a modulus suitable for a particular application. TIM 110 may also include an epoxy with silver particles for better thermal dissipation characteristics. Various thermal interface materials are available from Honeywell, Morristown, N.J. and from Ablestik Laboratories of Rancho Domingo, Calif., or Namics, Reno, Nev. Typically, thermal interface material 110 is cured at about 150° C.

Heat spreader 112 is also connected to substrate 104 via stiffener 113. The stiffener (also sometimes referred to as a "picture frame") is typically a flat piece of structure having substantially the same dimensions as the package substrate with a window in its center to clear the die. Stiffener 113 is typically made of predominantly copper. Stiffener 113 may also be nickel plated or oxidized to improve adhesion. The purpose of the stiffener is to constrain the substrate in order to prevent its warpage or other movement relative to the die, which may be caused by thermal cycling (e.g., changes in temperature) during package assembly, reliability testing, or field operation. Such movement may result from the different coefficients of thermal expansion (CTE) of the die and substrate materials, and may produce stress in the die or the package in causing electrical and mechanical failures.

Figure 2B:
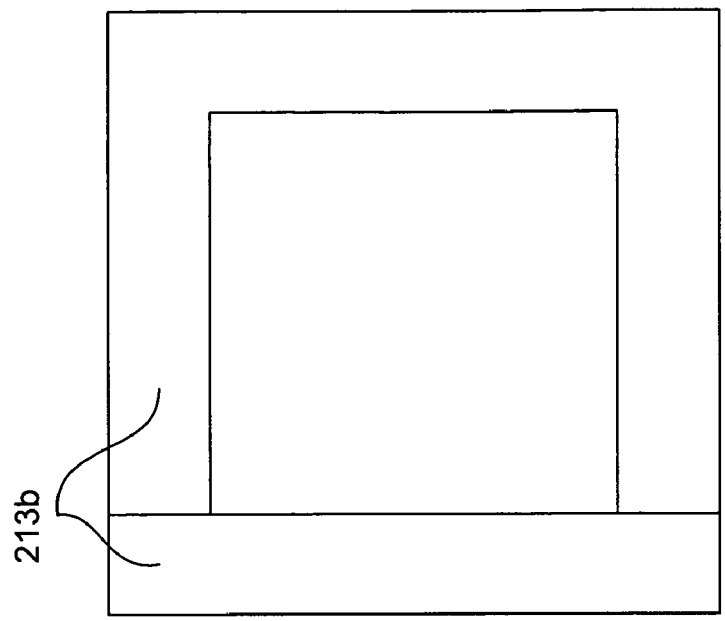
FIG. 2B illustrates a top view of a two-piece stiffener according to various embodiments of the present invention.
Figure 2A:
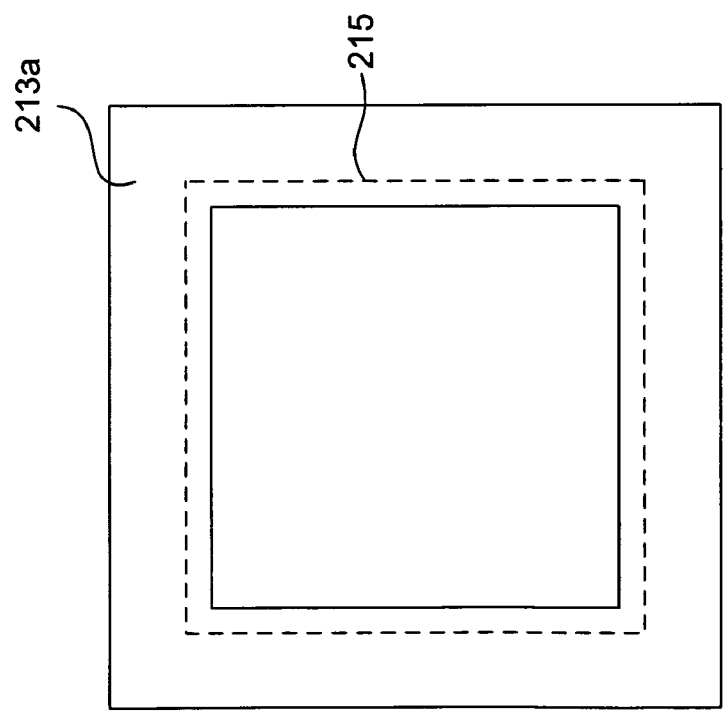
FIG. 2A illustrates a top view of a one-piece stiffener according to various embodiments of the present invention.

Stiffener 113 may either be in a single piece (i.e., one-piece) stiffener construction or in a multi-piece (e.g., two-piece) stiffener construction. In either case, it is referred to herein as a stiffener. The dimensions of the stiffener may vary with the size of the die. However, the width of a side of the stiffener is generally equal or greater than 1.5 mm whereas the thickness is generally between 0.3 to 0.9 mm. FIG. 2A illustrates a top view of a one-piece stiffener 213a. One-piece stiffener 213a may include an optional offset that forms a ledge 215 (see element 213a of FIG. 7B for further details). On the other hand, FIG. 2B illustrates a top view of a two-piece stiffener 213b according to various embodiments of the present invention. Two-piece stiffener 213b includes two separable members, which when combined form a picture-frame-like stiffener. It will be appreciated by those skilled in the art that stiffeners 213a and 213b can come in any size, shape, or form. For instance, gaps may exist within stiffeners 213a and 213b.

Referring back to FIG. 1, heat spreader 112 is connected to substrate 104 where the connection of heat spreader 112 to stiffener 113 is made with an adhesive 114a and the connection of stiffener 113 to substrate 104 is made with an adhesive 114b. Adhesives 114a and 114b can be any suitable adhesive for connecting stiffener 113 to heat spreader 112 and package substrate 104. Adjoining surfaces (e.g., heat spreader 112; stiffener 113) may include dendrites to create a rougher joining surface for better adhesion. In one embodiment, adhesives 114a and 114b have a relatively low modulus to allow for some flexibility in the overall connection between heat spreader 112 and substrate 104. Generally, low modulus adhesives for this purpose are silicone-based adhesives. Furthermore, adhesive 114a and 114b may have an associated glass transition temperature Tg in the range between 30° C. and 70° C.

Although adhesives 114a and 114b can be the same material or at least embody some of the same characteristics described herein, another embodiment allows them to be different. For example, adhesive 114a may have a modulus greater than that of adhesive 114b, such as where adhesive 114a has a modulus of about 6 GPa and where adhesive 114b has a modulus of about 0.4 GPa. In addition, adhesive 114a may have a Tg greater than that of adhesive 114b. In one embodiment, adhesive 114a may have a Tg equal or greater to 100° C., such as about 126° C. Generally, adhesives are cured at about 150° C.

Semiconductor die flip chip package 100 also includes a ball grid array (BGA) of solder balls 116 for electrically connecting die 102 (e.g., via solder bumps 106 and electrical traces/vias in package substrate 104) to a printed circuit board 118.

Although some semiconductor die flip chip packages (e.g., See U.S. patent application Ser. Nos. 10/305,671, 10/849,651, or 10/719,451, each of which is hereby incorporated by reference) may incorporate a form of warpage control that reduces the amount of warpage to within industry co-planarity specifications and allows an enclosed Si die flip-chip to operate reliably, such packages can be further improved upon with the incorporation of the present invention.

In the following FIGS. 3(A-C), 4(A-C), 5(A-C), 6(A-E), 7(A-C), and 8(A-E), various aspects of the present invention is further described. In particular, various structures and assembly procedures for incorporating a thin die into a semiconductor device package are described. The structures and assembly procedures can be suited for incorporating low-K Si dice and/or thin core substrates into semiconductor die flip chip packages. As mentioned earlier, well-known process operations have not been described in detail in order not to unnecessarily obscure the present invention.

FIGS. 3A, 3B, and 3C illustrate different standalone semiconductor device package components (e.g., heat spreader and die complexes). The semiconductor device package components facilitate easy and safe handling of a die for incorporation into a final semiconductor device package. FIG. 3A illustrates a cross-sectional view of a semiconductor device package component 300 according to various embodiments of the present invention. As shown, heat spreader 312a is attached to die 102 with TIM 110 applied between their respective surfaces. TIM 110 may first be applied to either the top surface of die 102 or the bottom surface of heat spreader 312a. Also shown are solder bumps 106 affixed to the bottom surface of die 102.

Heat spreader 312a is configured with a substantially uniform thickness 301 and a width 303 that is greater than that of die 102. For instance, if the die has a die size of 20×20 mm, then width 303 will be greater than 20 mm. Typically, width 303 will be about the same width as the underlying package substrate 104 of which die 102 is mounted. As such, heat spreader 312a and package substrate 104 can occupy the same footprint. On the other hand, if stiffener 113 is used, width 303 can be sized to cover a portion of stiffener 113. However, it will be appreciated by those skilled in the art that width 303 can be greater than that of package substrate 104 or stiffener 113.

FIG. 3B illustrates a cross-sectional view of a semiconductor device package component 320 according to various embodiments of the present invention. Heat spreader 312b is shown attached to die 102 with TIM 110. Die 102 is shown with solder bumps 106 affixed to its bottom surface. Although heat spreader 312b is configured similar to heat spreader 312a, heat spreader 312a is configured to have a substantially uniform thickness throughout its entire width 303 whereas heat spreader 312b is not. In one embodiment, heat spreader 312b is thicker at its center than at its periphery. That is, heat spreader 312b includes a center portion 307 having a thickness 305 that is greater than that (i.e., 301) of an edge portion 309.

In general, center portion 307 is used for mounting heat spreader 312b to die 102. Center portion 307 is typically sized to cover a substantial portion of the top surface of die 102. In one embodiment, the center portion 307 covers the entire top surface of die 102. The thicker center portion 307 can also facilitate greater heat transfer, thereby allowing for better heat dissipation of die 102.

FIG. 3C illustrates a cross-sectional view of a semiconductor device package component 340 according to various embodiments of the present invention. As shown, a heat spreader 312c is attached via TIM 110 to die 102, which has solder bumps 106 on its bottom surface. Heat spreader 312c is also similar to heat spreader 312a where a substantially uniform thickness exists throughout its entire width. However, heat spreader 312c generally has a smaller width than 312a. If stiffener 113 is employed, heat spreader 312c is usually configured with a width 303 that prevents heat spreader 312c from covering stiffener 113. In one embodiment, heat spreader 312c has a width that prevents heat spreader 312c from extending past stiffener 113.

Since FIGS. 4A, 4B, and 4C are interrelated, they will be discussed together. FIG. 4A illustrates a process flow for assembling a semiconductor die flip chip package 400 having a two-piece stiffener 213b and a heat spreader 312a of FIG. 3A. FIG. 4B illustrates a cross-sectional view of the disassembled semiconductor die flip chip package 400 having a two-piece stiffener 213b and a heat spreader 312a of FIG. 3A. FIG. 4C illustrates a cross-sectional view of the assembled semiconductor die flip chip package 400.

Referring to FIG. 4A, the process begins with attaching heat spreader 312a to die 102 in operation 401 to form a semiconductor device package component. Any conventional technique or mechanism may be used for the attachment. For instance, TIM 110 can be used. Next, attaching the combined complex of heat spreader 312a and die 102 to package substrate 104 is performed in operation 403. Here, solder bumps 106 are reflowed to join the combined complex to package substrate 104. Next, applying underfill 108 is performed in operation 405. Tilting or rotating the package 90 degrees can facilitate easy application of underfill 108.

Finally, inserting two-piece stiffener 213b is performed in operation 407. As shown by the arrows in FIG. 4B, two-piece stiffener 213b can be inserted from the sides of the package into the gap (formed by die 102 and solder bumps 106) between heat spreader 312a and package substrate 104. It should be noted that adhesives 114a and 114b are applied onto corresponding surfaces of two-piece stiffener 213b, heat spreader 312a, or package substrate 104. Adhesives 114a and 114b are generally applied before performing operation 407. However, curing the adhesives 114a and 114b is performed after operation 407.

Since FIGS. 5A, 5B, and 5C are also interrelated, they will be discussed together. FIG. 5A illustrates a process flow for assembling a semiconductor die flip chip package 500 having a two-piece stiffener 213b and a heat spreader 312b of FIG. 3B. FIG. 5B illustrates a cross-sectional view of the disassembled semiconductor die flip chip package 500 whereas FIG. 5C illustrates a cross-sectional view of the assembled semiconductor die flip chip package 500.

Referring to FIG. 5A, which is substantially similar to FIG. 4A, the process begins with attaching heat spreader 312b to die 102 in operation 501 to form a semiconductor device package component. Next, attaching heat spreader 312b and die 102 to package substrate 104 is performed in operation 503. Next, applying underfill 108 is performed in operation 505. As before, application of the underfill can be made easier by tilting or rotating the package to a suitable angle (e.g., 90 degrees). Finally, inserting two-piece stiffener 213b is performed in operation 507.

Since heat spreader 312b has a center portion 307 thicker than the edge portions 309, a thicker stiffener 213b may be used. Thick stiffeners can reduce the warpage of the final package. As such, the thickness of stiffener 213b and center portion 307 can be selected to control the package warpage. Also, it will be appreciated by those skilled in the art that the application of the underfill is made easier due to the increased clearance from the thicker center portion of heat spreader 312b. Further, heat spreader 312b can provide better thermal conductivity by using a thin TIM layer.

Figure 6A:
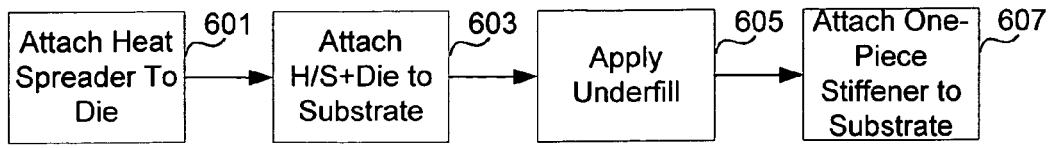
FIGS. 6A-6C illustrate various process flows for assembling a semiconductor die flip chip package having a one-piece stiffener and a heat spreader of FIG. 3C.
Figure 6B:
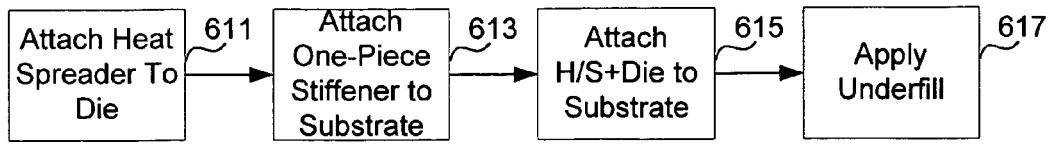
Figure 6C:
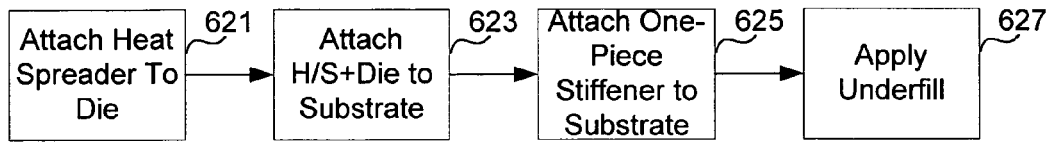
Figure 6D:
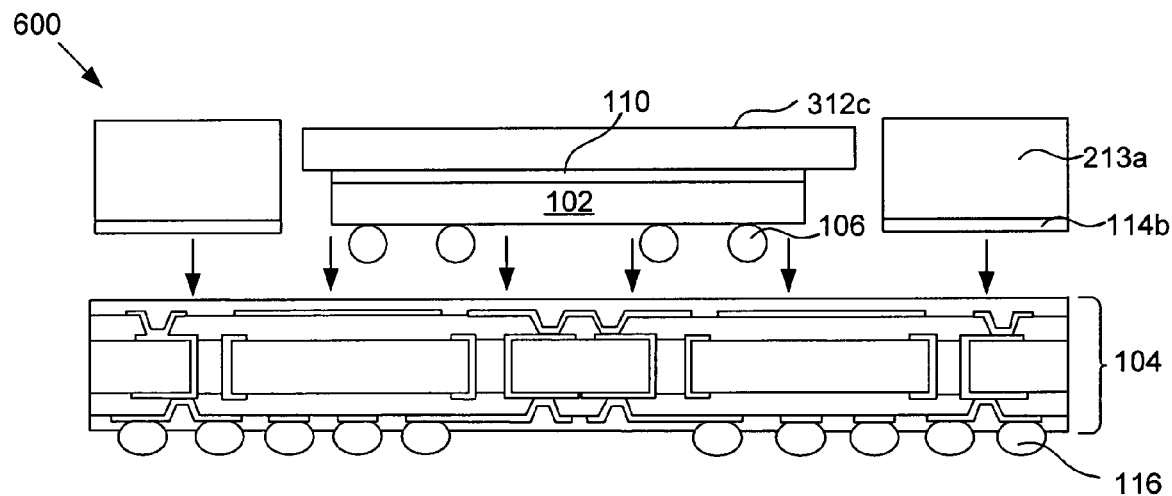
FIG. 6D illustrates a cross-sectional view of a disassembled semiconductor die flip chip package having a one-piece stiffener and a heat spreader of FIG. 3C.
Figure 6E:
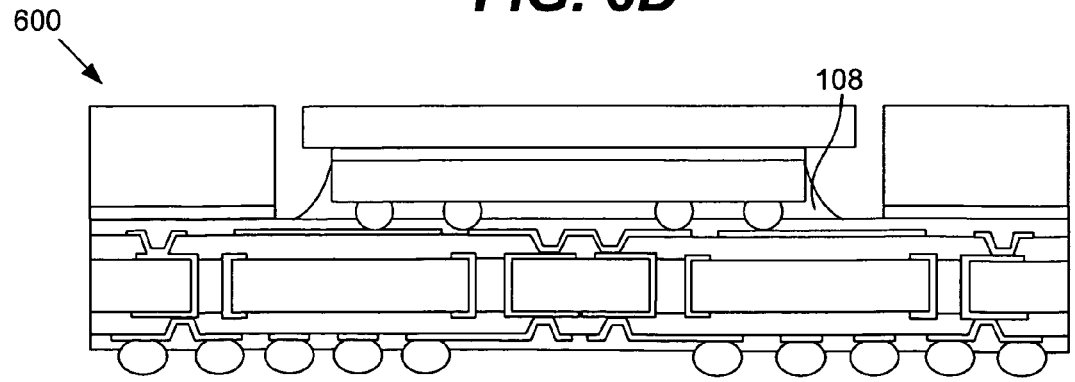
FIG. 6E illustrates a cross-sectional view of an assembled semiconductor die flip chip package having a one-piece stiffener and a heat spreader of FIG. 3C.

FIGS. 6A-6C illustrate various process flows for assembling a semiconductor die flip chip package 600 having a one-piece stiffener 213a and a heat spreader 312c of FIG. 3C. FIG. 6D illustrates a cross-sectional view of the disassembled semiconductor die flip chip package 600 and FIG. 6E illustrates a cross-sectional view of the assembled semiconductor die flip chip package 600.

One process is shown in FIG. 6A. The process begins with attaching heat spreader 312c to die 102 in operation 601 to form a semiconductor device package component. Next, attaching heat spreader 312c and die 102 complex to package substrate 104 is performed in operation 603. Next, applying underfill 108 is performed in operation 605. Finally, attaching one-piece stiffener 213a to package substrate 104 is performed in operation 607. One-piece stiffener 213a is attached to package substrate 104 from above such that it clears the semiconductor device package component (i.e., die 102 and heat spreader 312c complex).

Generally, the stiffener has a thickness that matches the die 102 and heat spreader 312c complex. A thick stiffener may be used for further warpage reduction. The process flow shown in FIG. 6A is advantageous for assembling a semiconductor die flip chip package 600 where a narrow gap exists between stiffener 213a and heat spreader 312c. This is because the application of underfill 108 can be easily performed without being obstructed by stiffener 213a, which is attached subsequently to package substrate 104 in operation 607.

Referring to FIG. 6B, another process begins with attaching heat spreader 312c to die 102 in operation 611 to form a semiconductor device package component. Next, attaching one-piece stiffener 213a to package substrate 104 is performed in operation 613. Next, attaching heat spreader 312c and die 102 to package substrate 104 is performed in operation 615. Finally, applying underfill 108 is performed in operation 617.

Since stiffener 213a and heat spreader 312 and die 102 complex are attached to package substrate 104 before performing the operation of applying underfill 108, they facilitate the application of underfill 108 by containing underfill 108 within a specified area (i.e., area between solder bumps 106 and stiffener 213a). This may provide better underfill flow control (e.g., minimize underfill spilling over into the stiffener and package substrate attachment area). However, the gap between stiffener 213a and die 102 and solder bumps 106 should be selected to allow underfill 108 to adequate form within. Stiffener 213a may also be selected with a thickness suitable for the amount of warpage control needed. In general, a thicker stiffener 213a provides more warpage reduction.

Referring to FIG. 6C, another process begins with attaching heat spreader 312c to die 102 in operation 621. Next, attaching heat spreader 312c and die 102 to package substrate 104 is performed in operation 623. Next, attaching one-piece stiffener 213a to package substrate 104 is performed in operation 625. Finally, applying underfill 108 is performed in operation 627. The process in FIG. 6C is similar to the process in FIG. 6B, except that operations 623 and 625 are reversed.

Figure 7A:
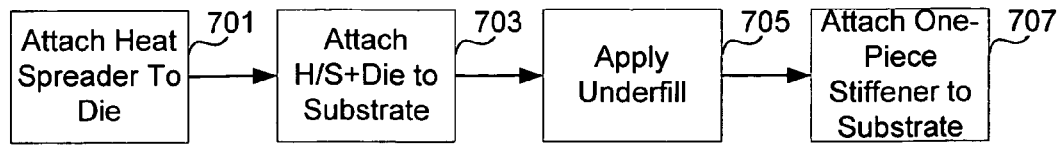
FIG. 7A illustrates a process flow for assembling a semiconductor die flip chip package having a one-piece stiffener and a heat spreader of FIG. 3C.
Figure 7B:
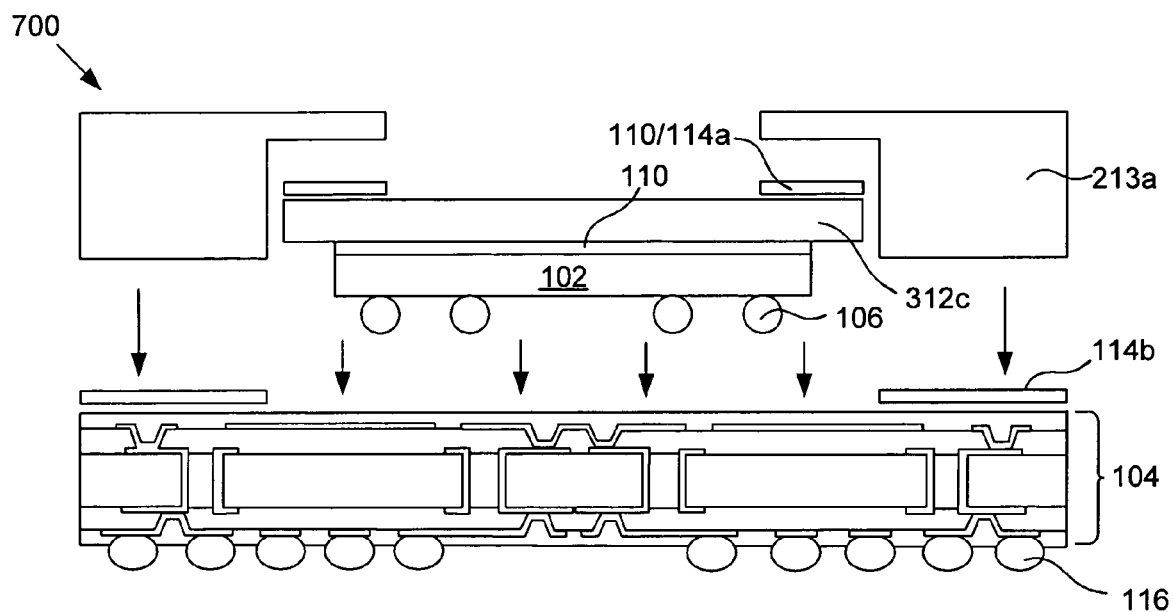
FIG. 7B illustrates a cross-sectional view of a disassembled semiconductor die flip chip package having a one-piece stiffener and a heat spreader of FIG. 3C.
Figure 7C:
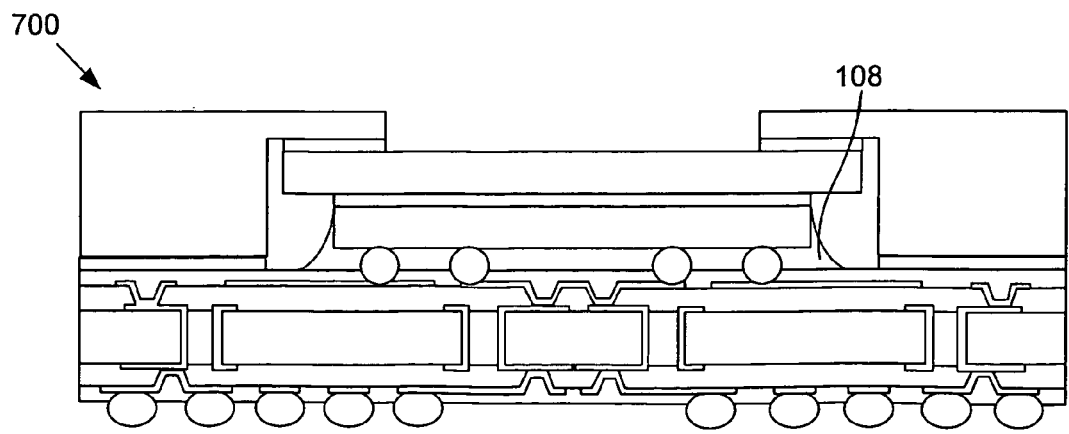
FIG. 7C illustrates a cross-sectional view of an assembled semiconductor die flip chip package having a one-piece stiffener and a heat spreader of FIG. 3C.

FIGS. 7A, 7B, and 7C are also interrelated and will be discussed together. FIG. 7A illustrates a process flow for assembling a semiconductor die flip chip package 700 having a one-piece stiffener 213a and a heat spreader 312c of FIG. 3C. FIG. 7B illustrates a cross-sectional view of the disassembled semiconductor die flip chip package 700 whereas FIG. 7C illustrates a cross-sectional view of the assembled semiconductor die flip chip package 700.

Referring to FIG. 7A, the process begins with attaching heat spreader 312c to die 102 in operation 701. Next, attaching heat spreader 312c and die 102 to package substrate 104 is performed in operation 703. Next, applying underfill 108 is performed in operation 705. Finally, attaching one-piece stiffener 213a to package substrate 104 is performed in operation 707. Attaching one-piece stiffener 213a to heat spreader 312c can be simultaneously performed in operation 707. Either adhesive 114a or TIM 110 can be used to attach stiffener 213a to heat spreader 312c.

The flow in FIG. 7A is substantially similar to the flow in FIG. 6A, except for attaching one-piece stiffener 213a to heat spreader 312c. As shown, stiffener 213a includes a ledge 215 that covers from above the gap between stiffener 213a and the complex of heat spreader 312c and die 102. Ledge 215 can provide more protection (e.g., from environmental elements) to die 102.

Figure 8A:
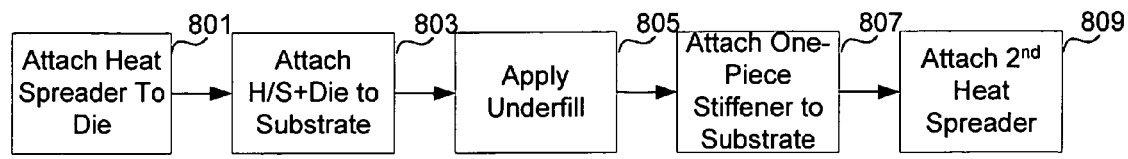
FIGS. 8A-8C illustrate various process flows for assembling a semiconductor die flip chip package having a one-piece stiffener and heat spreaders of FIGS. 3A and 3C.
Figure 8B:
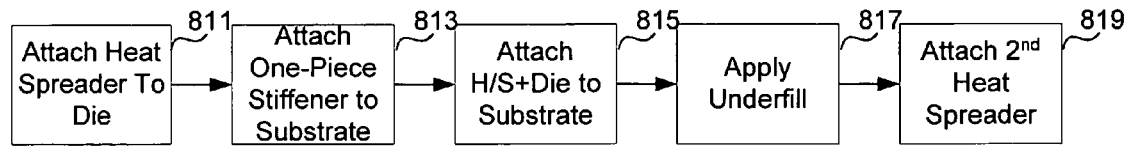
Figure 8C:
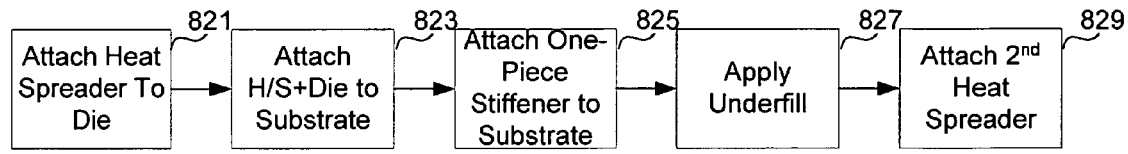
Figure 8D:
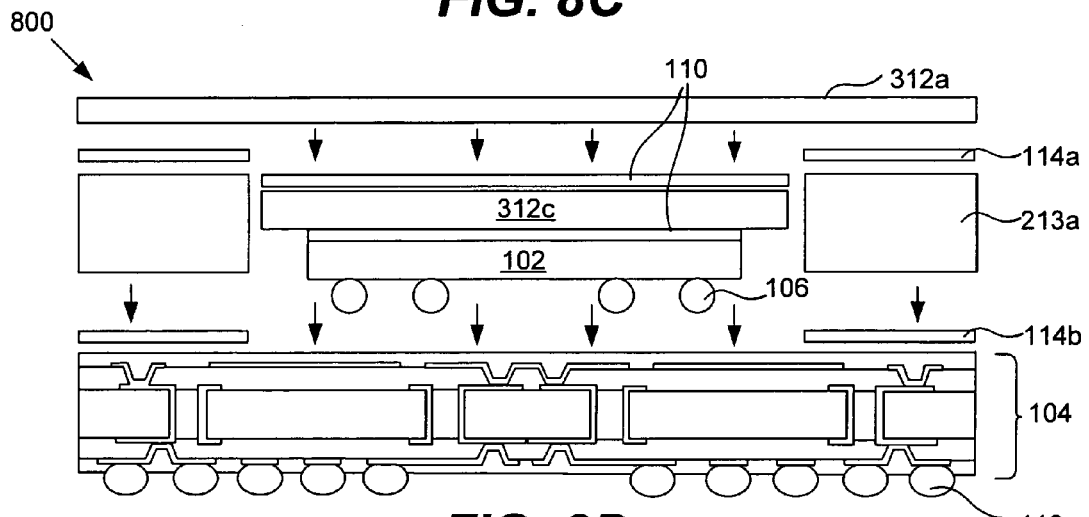
FIG. 8D illustrates a cross-sectional view of a disassembled semiconductor die flip chip package having a one-piece stiffener and heat spreaders of FIGS. 3A and 3C.
Figure 8E:
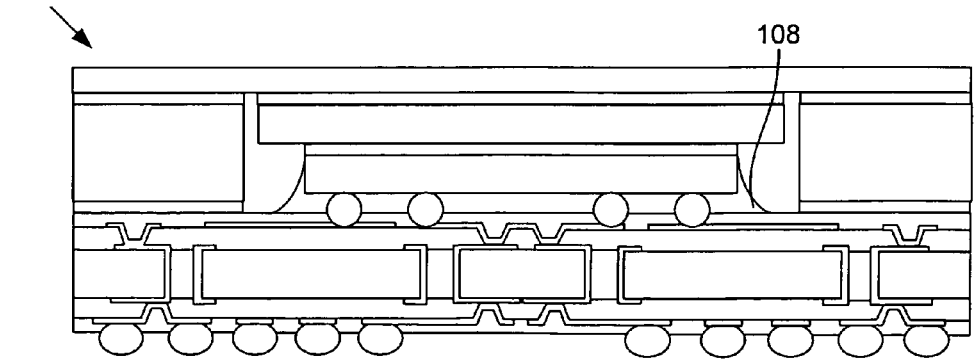
FIG. 8E illustrates a cross-sectional view of an assembled semiconductor die flip chip package having a one-piece stiffener and heat spreaders of FIGS. 3A and 3C.

FIGS. 8A-8C illustrate various process flows for assembling a semiconductor die flip chip package 800 having a one-piece stiffener 213a and heat spreaders 312a and 312c of FIGS. 3A and 3C. FIG. 8D illustrates a cross-sectional view of the disassembled semiconductor die flip chip package 800 and FIG. 8E illustrates a cross-sectional view of the assembled semiconductor die flip chip package 800. The semiconductor die flip chip package 800 in FIG. 8E is similar to the semiconductor die flip chip package 600 in FIG. 6E except for the attachment of a second heat spreader 312a. Further, except for the attachment of a second heat spreader 312a, the flows for FIGS. 8A, 8B, and 8C are also similar to the flows for FIGS. 6A, 6B, and 6C.

Referring to FIG. 8A, the process begins with attaching heat spreader 312c to die 102 in operation 801. Next, attaching heat spreader 312c and die 102 to package substrate 104 is performed in operation 803. Next, applying underfill 108 is performed in operation 805. Next, attaching one-piece stiffener 213a to package substrate 104 is performed in operation 807. Finally, attaching heat spreader 312a to stiffener 213a and heat spreader 312c is performed in operation 809.

Referring to FIG. 8B, the process begins with attaching heat spreader 312c to die 102 in operation 811. Next, attaching one-piece stiffener 213a to package substrate 104 is performed in operation 813. Next, attaching heat spreader 312c and die 102 to package substrate 104 is performed in operation 815. Next, applying underfill 108 is performed in operation 817. Finally, attaching heat spreader 312a to stiffener 213a and heat spreader 312c is performed in operation 819.

Referring to FIG. 8C, the process begins with attaching heat spreader 312c to die 102 in operation 821. Next, attaching heat spreader 312c and die 102 to package substrate 104 is performed in operation 823. Next, attaching one-piece stiffener 213a to package substrate 104 is performed in operation 825. Next, applying underfill 108 is performed in operation 827. Finally, attaching heat spreader 312a to stiffener 213a and heat spreader 312c is performed in operation 829.

According to various embodiments, the attachment of the second heat spreader 312a in operations 809, 819, and 829 include attaching heat spreader 312a to stiffener 213a via adhesive 114a and attaching heat spreader 312a to heat spreader 312c via TIM 110. Typically, the attachment of second heat spreader 312a to stiffener 213a and heat spreader 312c is performed substantially simultaneously in time. The second heat spreader 312a provides the advantage of covering from above the gaps between stiffener 213a and heat spreader 312c. Further, depending on the thickness of the second heat spreader 312a, a reduction in warpage of the semiconductor die flip chip package 800 can be realized.

Warpage testing and reliability testing for such packages are generally modeled with the assistance of a computer. Modeled warpage testing for such packages generally involves simulating industry available and accepted co-planarity standards, such as JEDEC specification MS-034. In practice, however, measuring the warpage or bow involves using a commercially available warpage or bow measuring tool. For example, RVSI Models LS7700, LS3700, and LS7350 DB, available from Robotic Vision Systems, Inc. of Nashua, N.H. may be used. Generally, warpage testing is conducted and measured after the semiconductor die flip chip package has been formed and before the semiconductor die flip chip package is subjected to reliability testing.

Similarly, modeled reliability testing for such packages generally involves simulating industry available and accepted reliability testing standards such as those established by the Electronic Industries Association (EIA) or the Joint Electron Device Engineering Council (JEDEC). For example, JESD22-A104 and Mil Std 1010. In one embodiment, simulated industrial grade reliability testing is performed and includes cycling the temperature between −55° C. to 125° C. and/or running 1000 cycles. Temperature cycling is conducted to determine the resistance of the die to high and low temperature extremes. This environmental stress test is designed to simulate the extensive changes in temperature to which the die and the package may be exposed. Typically, to pass the test, the die, layers of low-K material, substrate, underfill, and/or other package components should not show signs of damage such as cracking, chipping, delaminating, or breaking.

The foregoing invention presents many advantages over conventional semiconductor die flip chip packages. For example, the foregoing invention provides a packaging solution for thin package substrates (even coreless package substrates), low-K Si dice, and future extra low-K Si dice. Further, a package with less bowing and improved co-planarity (e.g., in compliance with industry specifications; about 0.20 mm or 8 mils per JDEC) with the surface to which it is ultimately bound can be realized; thereby, improving the reliability of the package. Moreover, a package that is relatively lighter and more robust than conventional semiconductor die flip chip packages (particularly for large package sizes and large die sizes) can be realized. Also, the present invention provides a simple efficient solution to incorporate a thin die into a semiconductor die flip chip package.

Although the foregoing invention has been described in some detail for purposes of clarity of understanding, it will be apparent that certain changes and modifications may be practiced within the scope of the appended claims. Therefore, the present embodiments are to be considered as illustrative and not restrictive, and the invention is not to be limited to the details given herein, but may be modified within the scope and equivalents of the appended claims.

What is claimed is:

1. A method for packaging a semiconductor device, comprising:
    coupling a heat spreader having top and bottom surfaces to a die having top and bottom surfaces, wherein the bottom surface of the heat spreader is coupled with the top surface of the die;
    coupling the die to a package substrate having a die surface and a board surface, wherein the coupling of the heat spreader to the die is performed prior to coupling the die to the package substrate;
    coupling a stiffener to the package substrate, wherein coupling the stiffener to the package substrate is performed after coupling the die to the package substrate and prior to applying underfill between the die and the package substrate; and
    applying underfill between the die and the package substrate after coupling the die to the package substrate.

2. The method of claim 1, wherein the heat spreader has a footprint that extends beyond that of the die when the heat spreader is centered on top of the die, the method comprising:
    tilting the semiconductor device package at an angle to facilitate application of the underfill between the die and the package substrate.

3. The method of claim 1, wherein coupling the heat spreader to the die comprises:
    applying a thermal interface material between the heat spreader and the die, the thermal interface material configured to attach the heat spreader to the die.

4. The method of claim 1, wherein the die includes solder bumps on the bottom surface of the die.

5. The method of claim 4, wherein coupling the die to the package substrate comprises:
    reflowing the solder bumps to attach the die to the package substrate.

6. The method of claim 1, wherein the package substrate has a core with a thickness between 60 and 400 microns.

7. The method of claim 1, wherein the die has a thickness between 6 and 20 mils.

8. The method of claim 7, wherein the die has a die size of at least 10 mm×10 mm.

9. The method of claim 1, wherein the heat spreader is thicker at a center portion than at a periphery portion, and wherein coupling the heat spreader to the die comprises:
    coupling the center portion to the top surface of the die.

10. The method of claim 9, wherein the center portion substantially covers the top surface of the die.

11. The method of claim 1, wherein a gap between the stiffener and the heat spreader provides access to the die to apply the underfill.

12. The method of claim 1, wherein the die is a low-K Si die.

* * * * *

UNITED STATES PATENT AND TRADEMARK OFFICE
CERTIFICATE OF CORRECTION

PATENT NO. : 7,585,702 B1 Page 1 of 1
APPLICATION NO. : 11/270676
DATED : September 8, 2009
INVENTOR(S) : Wang et al.

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 455 days.

Signed and Sealed this

Fourteenth Day of September, 2010

David J. Kappos
*Director of the United States Patent and Trademark Office*